US010121599B2

United States Patent
Aoyama et al.

(10) Patent No.: US 10,121,599 B2
(45) Date of Patent: Nov. 6, 2018

(54) METHOD FOR PRODUCING ELECTROLYTIC CAPACITOR

(71) Applicant: PANASONIC INTELLECTUAL PROPERTY MANAGEMENT CO., LTD., Osaka (JP)

(72) Inventors: Tatsuji Aoyama, Yamaguchi (JP); Tomoyuki Tashiro, Yamaguchi (JP); Junya Kushizaki, Yamaguchi (JP); Shunpei Matsushita, Yamaguchi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/954,179

(22) Filed: Apr. 16, 2018

(65) Prior Publication Data

US 2018/0240600 A1    Aug. 23, 2018

Related U.S. Application Data

(63) Continuation of application No. 15/375,288, filed on Dec. 12, 2016, now Pat. No. 9,978,526, which is a
(Continued)

(30) Foreign Application Priority Data

Jun. 23, 2014    (JP) .................................. 2014-128448

(51) Int. Cl.
*H01L 21/20*  (2006.01)
*H01G 9/00*   (2006.01)
(Continued)

(52) U.S. Cl.
CPC ............. *H01G 9/0032* (2013.01); *H01G 9/02* (2013.01); *H01G 9/035* (2013.01); *H01G 9/07* (2013.01);
(Continued)

(58) Field of Classification Search
CPC ..... H01L 28/10; H01L 23/5227; H01L 27/08; H01L 28/40; H01G 9/0032; H01G 9/02;
(Continued)

(56) References Cited

U.S. PATENT DOCUMENTS 5,462,820 A * 10/1995 Tanaka .................... H01M 2/08
429/174
2008/0002334 A1   1/2008 Kakuma et al.
(Continued)

FOREIGN PATENT DOCUMENTS

JP    2008-010657 A    1/2008
JP    2014-007401 A    1/2014
(Continued)

OTHER PUBLICATIONS

International Search Report of PCT application No. PCT/JP2015/002901 dated Aug. 4, 2015; with English translation.
(Continued)

*Primary Examiner* — Thinh T Nguyen
(74) *Attorney, Agent, or Firm* — McDermott Will & Emery LLP

(57) ABSTRACT

A method for producing an electrolytic capacitor includes: a first step of preparing a capacitor element that includes an anode body on which a dielectric layer is formed; a second step of impregnating the capacitor element with a first treatment solution containing a first solvent and a conductive polymer; a third step of impregnating, after the second step, the capacitor element with a second treatment solution containing a second solvent; and a fourth step of impregnating, after the third step, the capacitor element with an electrolyte solution containing a third solvent. Both the second solvent and the third solvent are an aprotic solvent.

12 Claims, 1 Drawing Sheet

Related U.S. Application Data continuation of application No. PCT/JP2015/002901, filed on Jun. 10, 2015.

(51) Int. Cl.
| | | |
|---|---|---|
| *H01G 9/02* | (2006.01) | |
| *H01G 9/035* | (2006.01) | |
| *H01G 9/07* | (2006.01) | |
| H01G 9/145 | (2006.01) | |
| H01G 9/008 | (2006.01) | |
| H01G 9/15 | (2006.01) | |
| H01L 49/02 | (2006.01) | |
| H01L 23/522 | (2006.01) | |
| H01L 27/08 | (2006.01) | |

(52) U.S. Cl.
CPC ............ *H01G 9/008* (2013.01); *H01G 9/0029* (2013.01); *H01G 9/145* (2013.01); *H01G 9/15* (2013.01); *H01L 23/5227* (2013.01); *H01L 27/08* (2013.01); *H01L 28/10* (2013.01); *H01L 28/40* (2013.01)

(58) Field of Classification Search
CPC .......... H01G 9/035; H01G 9/07; H01G 9/008; H01G 9/0029; H01G 9/145
USPC ........ 438/381, 393, 396, 239, 210; 257/532, 257/E21.008, E51.003; 361/502, 503
See application file for complete search history.

(56) References Cited

U.S. PATENT DOCUMENTS

| 2008/0247119 | A1 | 10/2008 | Kakuma et al. | |
|---|---|---|---|---|
| 2009/0103241 | A1* | 4/2009 | Kikuchi | C08G 8/20 361/502 |
| 2012/0250226 | A1 | 10/2012 | Hirota et al. | |

FOREIGN PATENT DOCUMENTS

| JP | 2014-067949 A | 4/2014 |
|---|---|---|
| JP | 2014-082392 A | 5/2014 |

OTHER PUBLICATIONS

Notice of Allowance issued in U.S. Appl. No. 15/375,288, dated Jan. 18, 2018.

\* cited by examiner

METHOD FOR PRODUCING ELECTROLYTIC CAPACITOR

RELATED APPLICATIONS

This application is a Continuation of U.S. patent application Ser. No. 15/375,288, filed on Dec. 12, 2016, which is a Continuation of International Patent Application No. PCT/JP2015/002901, filed on Jun. 10, 2015, which in turn claims the benefit of Japanese Application No. 2014-128448, filed on Jun. 23, 2014, the entire disclosures of which Applications are incorporated by reference herein.

BACKGROUND

1. Technical Field

The present disclosure relates to a method for producing an electrolytic capacitor, and, in more detail, relates to a method for producing an electrolytic capacitor in which an impregnation property of an electrolyte solution into a capacitor element is improved.

2. Description of the Related Art

Along with digitalization of electronic devices, compactification, large capacity, and low equivalent series resistance (ESR) in a high frequency range have been required of capacitors used in the electronic devices.

Conventionally, plastic film capacitors, laminated ceramic capacitors, and the like have been used as capacitors for a high frequency range in many cases, however, these capacitors are relatively small in capacity.

Promising candidates as small-sized, large capacity, and low ESR capacitors are electrolytic capacitors including as a cathode material a conductive polymer such as polypyrrole, polythiophene, polyfuran, or polyaniline. Proposed is, for example, a capacitor element that includes a dielectric layer-formed anode foil, and a solid electrolyte layer including a conductive polymer as a cathode material, which is provided on the anode foil.

It is pointed out that the electrolytic capacitor as described above is low in withstand voltage characteristics because the electrolytic capacitor is poor in restoration ability of the dielectric layer. Therefore, a technique has been developed for using an electrolyte solution excellent in the restoration ability of a dielectric layer in combination with a solid electrolyte layer. For example, Unexamined Japanese Patent Publication No. 2008-010657 discloses an electrolytic capacitor obtained by impregnating a solid electrolyte layer with an electrolyte solution.

SUMMARY

A method for producing an electrolytic capacitor according to the present disclosure includes: a first step of preparing a capacitor element that includes an anode body on which a dielectric layer is formed; a second step of impregnating the capacitor element with a first treatment solution containing a first solvent and a conductive polymer; a third step of impregnating, after the second step, the capacitor element with a second treatment solution containing a second solvent; and a fourth step of impregnating, after the third step, the capacitor element with an electrolyte solution containing a third solvent. Both the second solvent and the third solvent are an aprotic solvent.

According to the present disclosure, there can be provided an electrolytic capacitor in which an impregnation property of an electrolyte solution into a capacitor element is improved.

DETAILED DESCRIPTION OF EMBODIMENT

Prior to describing an exemplary embodiment of the present disclosure, a problem in conventional techniques will be briefly described. The restoration ability by the electrolyte solution is exhibited only when the electrolyte solution permeates a surface and an inside of the dielectric layer. Therefore, it is desired to improve an impregnation property of the electrolyte solution into a capacitor element.

<<Electrolytic Capacitor>>

Figure 1:
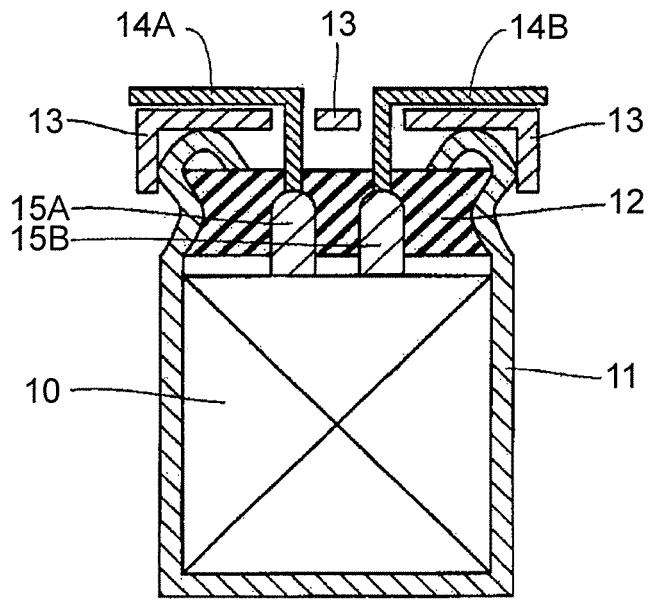
FIG. 1 is a schematic sectional view of an electrolytic capacitor according to an exemplary embodiment of the present disclosure.
Figure 2:
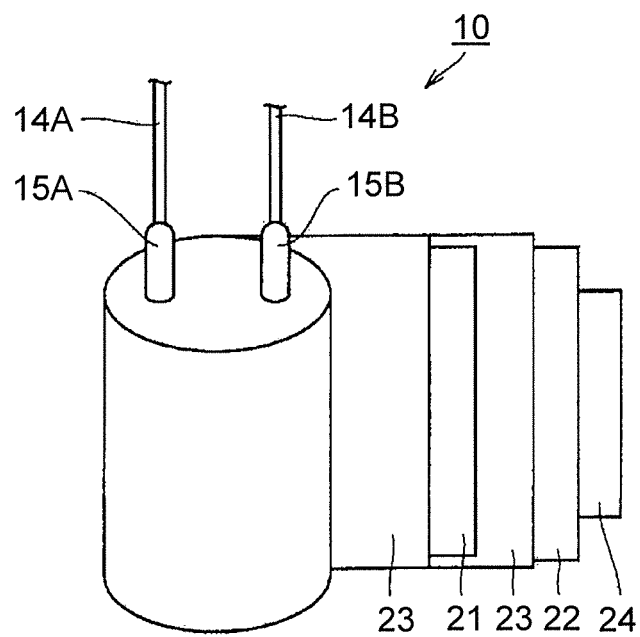
FIG. 2 is a schematic view illustrating a configuration of a capacitor element according to the same exemplary embodiment.

FIG. 1 is a schematic sectional view of an electrolytic capacitor according to a present exemplary embodiment, and FIG. 2 is a schematic view of a partially developed capacitor element included in the same electrolytic capacitor.

The electrolytic capacitor includes, for example, capacitor element 10, bottomed case 11 that houses capacitor element 10, sealing member 12 that seals an opening of bottomed case 11, base plate 13 that covers sealing member 12, lead wires 14A, 14B that are lead out from sealing member 12 and penetrate base plate 13, lead tabs 15A, 15B that connect the lead wires to electrodes of capacitor element 10, respectively, and an electrolyte solution (not shown). Bottomed case 11 is, at a part near an opening end, processed inward by drawing, and is, at the opening end, swaged to sealing member 12 for curling.

Capacitor element 10 includes an anode body having a dielectric layer. For example, capacitor element 10 may include, in addition to anode body 21, lead tab 15A connected to anode body 21, cathode body 22, lead tab 15B connected to cathode body 22, and separator 23 interposed between anode body 21 and cathode body 22, as shown in FIG. 2. In this case, anode body 21 and cathode body 22 is wound with separator 23 interposed between the anode body and the cathode body. An outermost periphery of capacitor element 10 is fixed with fastening tape 24. FIG. 2 shows partially developed capacitor element 10 before the outermost periphery of the capacitor element is fixed.

Anode body 21 includes a metal foil whose surface is roughened so as to include projections and recesses, and a dielectric layer is formed on the metal foil having the projections and recesses. A conductive polymer is attached to at least a part of a surface of the dielectric layer to form a conductive polymer layer. The conductive polymer layer may cover at least a part of a surface of cathode body 22 and/or a surface of separator 23. Conductive polymer layer-formed capacitor element 10 is housed in an outer case together with the electrolyte solution.

<<Method for Producing Electrolytic Capacitor>>

Hereinafter, an example of the method for producing an electrolytic capacitor according to the present exemplary embodiment is described according to each of steps.

(i) Step of Preparing Capacitor Element (First Step)

First, a raw material of anode body 21, i.e. a metal foil is prepared. A type of the metal is not particularly limited, but it is preferable to use a valve action metal such as aluminum, tantalum, or niobium, or an alloy including a valve action metal, from the viewpoint of facilitating formation of the dielectric layer.

Next, a surface of the metal foil is roughened. By the roughening, a plurality of projections and recesses are formed on the surface of the metal foil. The roughening is preferably performed by etching the metal foil. The etching may be performed by, for example, a DC electrolytic method or an AC electrolytic method.

Next, a dielectric layer is formed on the roughened surface of the metal foil. A method for forming the dielectric layer is not particularly limited, and the dielectric layer can be formed by subjecting the metal foil to a chemical conversion treatment. The chemical conversion treatment may be performed by, for example, immersing the metal foil in a chemical conversion solution such as an ammonium adipate solution, followed by application of a voltage.

Normally, a large foil of, for example, a valve action metal (metal foil) is subjected to a roughening treatment and a chemical conversion treatment from the viewpoint of mass productivity. In this case, the treated foil is cut into a desired size to prepare anode body 21.

Further, cathode body 22 is prepared.

A metal foil can also be used for cathode body 22 as with the anode body. A type of the metal is not particularly limited, but it is preferable to use a valve action metal such as aluminum, tantalum, or niobium, or an alloy including a valve action metal. A surface of cathode body 22 may be roughened as necessary. Further, on the surface of cathode body 22 may be provided a chemical conversion film, a film of a metal different from the metal that constitutes the cathode body (different type of metal), or a nonmetal film. Examples of the different type of metal and the nonmetal include metals such as titanium and nonmetals such as carbon, respectively.

Next, anode body 21 and cathode body 22 are wound with separator 23 interposed between the anode body and the cathode body. At this time, the winding can be conducted while lead tabs 15A, 15B connected to the electrodes, respectively, are rolled in the anode body, the cathode body, and the separator, to cause lead tabs 15A, 15B to stand up from capacitor element 10 as shown in FIG. 2.

Separator 23 may include a fiber of for example, cellulose, polyethylene terephthalate, a vinylon, or a polyamide (e.g., an aliphatic polyamide fiber such as nylon and an aromatic polyamide fiber such as aramid). Thickness of separator 23 preferably ranges from 10 µm to 100 µm. Separator 23 having a thickness in this range increases an effect of suppressing a short circuit of the electrolytic capacitor.

A material for lead tabs 15A, 15B is not particularly limited as long as the material is a conductive material. Surfaces of lead tabs 15A, 15B may be subjected to a chemical conversion treatment. Further, lead tabs 15A, 15B may be covered with a resin material at a part in contact with sealing member 12 and a part connecting to lead wires 14A, 14B.

A material for lead wires 14A, 14B connected to lead tabs 15A, 15B, respectively, is not also particularly limited as long as the material is a conductive material.

Then, fastening tape 24 is disposed on an outer surface of cathode body 22 positioned at an outermost layer of anode body 21 wound, cathode body 22, and separator 23, to fix an end of cathode body 22 with fastening tape 24. When anode body 21 is prepared by cutting a large metal foil, capacitor element 10 may further be subjected to a chemical conversion treatment in order to provide a dielectric layer on a cut surface of anode body 21.

(ii) Step of Impregnating Capacitor Element with First Treatment Solution (Second Step)

Next, capacitor element 10 is impregnated with a first treatment solution.

A method for impregnating capacitor element 10 with the first treatment solution is not particularly limited. For example, there can be used a method for immersing capacitor element 10 in the first treatment solution housed in a container, and a method for dropping the first treatment solution onto capacitor element 10. An impregnation period depends on a size of capacitor element 10, but ranges, for example, from 1 second to 5 hours, preferably from 1 minute to 30 minutes. The impregnation may be conducted in an atmosphere under a reduced pressure ranging, for example, from 10 kPa to 100 kPa, preferably from 40 kPa to 100 kPa. Ultrasonic vibration may also be applied to capacitor element 10 or the first treatment solution while capacitor element 10 is impregnated with the first treatment solution.

The first treatment solution contains a conductive polymer and a first solvent. The first treatment solution may be either a solution of a conductive polymer or a dispersion liquid of a conductive polymer. The solution of a conductive polymer is a solution obtained by dissolving a conductive polymer in the first solvent, and the conductive polymer is uniformly distributed in the solution. In a case of the dispersion liquid of a conductive polymer, the conductive polymer is, in a state of particles, dispersed in a dispersion solvent containing the first solvent. The first treatment solution can be obtained by, for example, a method for dispersing particles of a conductive polymer in a dispersion solvent containing the first solvent, or a method for polymerizing a precursor monomer of a conductive polymer in a dispersion solvent containing the first solvent to generate particles of the conductive polymer in the dispersion solvent containing the first solvent.

Examples of the conductive polymer include polypyrrole, polythiophene, polyfuran, polyaniline, polyacetylene, polyphenylene, polyphenylene vinylene, polyacene, and polythiophene vinylene. A single one or two or more in combination of these conductive polymers may be used, or a copolymer of two or more monomers may also be used.

In the present disclosure, polypyrrole, polythiophene, polyfuran, polyaniline, and the like mean polymers having, as a basic skeleton, polypyrrole, polythiophene, polyfuran, polyaniline, and the like, respectively. Therefore, polypyrrole, polythiophene, polyfuran, polyaniline, and the like also include their derivatives. For example, polythiophene includes poly(3,4-ethylene dioxythiophene) and the like.

The conductive polymer may include a dopant. As the dopant, a polyanion can be used. Specific examples of the polyanion include polyvinylsulfonic acid, polystyrenesulfonic acid, polyallylsulfonic acid, polyacrylsulfonic acid, polymethacrylsulfonic acid, poly(2-acrylamido-2-methylpropanesulfonic acid), polyisoprenesulfonic acid, and polyacrylic acid. Especially, a polyanion derived from polystyrenesulfonic acid is preferable. A single one or two or more in combination of these polyanions may be used. These polyanions may be a polymer of a single monomer or a copolymer of two or more monomers.

A weight average molecular weight of the polyanion is not particularly limited, and ranges, for example, from 1,000 to 1,000,000. A conductive polymer including such a polyanion is easily and uniformly dispersed in a dispersion solvent containing the first solvent, facilitating uniform attachment of the conductive polymer to the surface of the dielectric layer.

An average particle diameter of particles of the conductive polymer is not particularly limited, and can be appropriately adjusted by, for example, polymerization conditions and dispersion conditions. For example, the average particle diameter of particles of the conductive polymer may range from 0.01 μm to 0.5 μm. Here, the average particle diameter is a median diameter in a volume particle size distribution obtained by measurement with a particle diameter measuring apparatus according to dynamic light scattering.

Concentration of the conductive polymer (including a dopant, or a polyanion) in the first treatment solution preferably ranges from 0.5% by mass to 10% by mass. The first treatment solution having such a concentration is suitable for attachment of an appropriate amount of the conductive polymer and is easily impregnated into capacitor element 10 to give advantages for improvement of productivity.

The first solvent is not particularly limited, and may be water or a nonaqueous solvent. The nonaqueous solvent is a collective term for liquids except water, and includes an organic solvent and an ionic liquid. As the first solvent, a polar solvent is especially preferable. The polar solvent may be a protic solvent or an aprotic solvent. Especially, the first solvent is preferably a protic solvent.

Examples of the protic solvent include alcohols such as methanol, ethanol, propanol, butanol, ethylene glycol (EG), propylene glycol, polyethylene glycol (PEG), diethylene glycol monobutyl ether, glycerin, 1-propanol, butanol, and polyglycerin, formaldehyde, and water. Examples of the aprotic solvent include amides such as N-methylacetamide, N,N-dimethylformamide, and N-methyl-2-pyrrolidone; esters such as methyl acetate and γ-butyrolactone (γBL); ketones such as methyl ethyl ketone; ethers such as 1,4-dioxane; sulfur-containing compounds such as dimethylsulfoxide and sulfolane (SL); and carbonate compounds such as propylene carbonate.

Particularly, the first solvent is preferably water from the viewpoint of handleability and dispersibility of particles of the conductive polymer. When the first solvent is water, water accounts for preferably 50% by mass or more, further preferably 70% by mass or more, particularly preferably 90% by mass or more of a dispersion solvent in the first treatment solution.

The dispersion solvent contained in the first treatment solution may contain a plurality of different first solvents. For example, the dispersion solvent may contain, together with water, a first solvent other than water. The first solvent that is used together with water and is other than water is preferably a polar solvent (the above-described protic solvents and/or the above-described aprotic solvents).

When the first treatment solution contains water as the first solvent, the first solvent other than water is preferably less than 50% by mass, further preferably less than 30% by mass, particularly preferably less than 10% by mass of the dispersion solvent in the first treatment solution. Further, the first treatment solution may contain, together with the first solvent, a solvent different from the first solvent.

(iii) Step of Impregnating Capacitor Element with Second Treatment Solution (Third step)

Next, capacitor element 10 that has been impregnated with the first treatment solution is impregnated with a second treatment solution.

Permeability of an electrolyte solution involves proximity in solubility parameter between a solvent included in the capacitor element before impregnation with the electrolyte solution and a solvent contained in the electrolyte solution. The permeability of the electrolyte solution is improved by the second treatment solution containing a protic solvent as a second solvent when the electrolyte solution contains a protic solvent as a third solvent, or by the second treatment solution containing an aprotic solvent as a second solvent when the electrolyte solution contains an aprotic solvent as a third solvent. With such a combination of the second solvent and the third solvent, the permeability of the electrolyte solution is improved even when the second solvent is removed from the second solvent-containing capacitor element before impregnation with the electrolyte solution, and then the capacitor element is impregnated with the electrolyte solution containing the third solvent.

(iii-1) When Second Solvent being Protic Solvent

When the second treatment solution contains a protic solvent as the second solvent (hereinafter, referred to as a protic second solvent), examples of the protic second solvent include the same protic solvents as exemplified for the first solvent. Especially, the protic second solvent is preferably one selected from the group consisting of diethylene glycol monobutyl ether, EG, PEG, propylene glycol, glycerin, polyglycerin, 1-propanol, and butanol. A weight average molecular weight (Mw) of PEG ranges preferably from 200 to 6,000, more preferably from 200 to 400. The second treatment solution may contain a plurality of protic second solvents. The protic second solvent preferably has a boiling point higher than a boiling point of the first solvent.

Especially, the protic second solvent is preferably the same protic solvent as a protic solvent contained in the electrolyte solution as the third solvent (hereinafter, referred to as a protic third solvent). Examples of the protic solvent used in common as the protic second solvent and the protic third solvent include EG, PEG, glycerin, and polyglycerin.

Further, the protic second solvent is preferably the same protic solvent as a protic solvent contained in the above-described first treatment solution as the first solvent (hereinafter, referred to as a protic first solvent) and the protic third solvent. Examples of the protic solvent used in common as the protic first solvent, the protic second solvent, and the protic third solvent include EG, PEG, glycerin, and polyglycerin.

The second treatment solution may contain a solvent, e.g., an aprotic solvent, different from the protic second solvent. Examples of the aprotic solvent similarly include the aprotic solvents exemplified as the first solvent. A single one or two or more in combination of these aprotic solvents may be contained. The second treatment solution may also contain a solute. Examples of the solute include acids such as a carboxylic acid, a sulfonic acid, phosphoric acid, and boric acid and salts of these acids.

The protic second solvent accounts for preferably 30% by mass or more, further preferably 50% by mass or more, particularly preferably 70% by mass or more, relative to a whole solvent contained in the second treatment solution. With these ranges of the protic second solvent, the permeability of the electrolyte solution is further improved. When the electrolyte solution contains an aprotic solvent together with the protic third solvent, it is preferable that the second treatment solution also contain an aprotic solvent together with the protic second solvent.

(iii-2) When Second Solvent being Aprotic Solvent

When the second treatment solution contains an aprotic solvent as the second solvent (hereinafter, referred to as an aprotic second solvent), examples of the aprotic second solvent include the same aprotic solvents as exemplified for the first solvent. Especially, the aprotic second solvent is preferably one selected from the group consisting of γBL, N-methyl-2-pyrrolidone, dimethylsulfoxide, SL, propylene carbonate, and dimethyl carbonate. The second treatment solution may contain a plurality of aprotic second solvents. The aprotic second solvent preferably has a boiling point higher than a boiling point of the first solvent.

Especially, the aprotic second solvent is preferably the same aprotic solvent as an aprotic solvent contained in the electrolyte solution as the third solvent (hereinafter, referred to as an aprotic third solvent). Examples of the aprotic solvent used in common as the aprotic second solvent and the aprotic third solvent include γBL, SL, N-methyl-2-pyrrolidone, and dimethylsulfoxide. A single one or two or more in combination of these aprotic solvents may be contained.

Further, the aprotic second solvent is preferably the same aprotic solvent as an aprotic solvent contained in the above-described first treatment solution as the first solvent (hereinafter, referred to as an aprotic first solvent) and the aprotic third solvent. Examples of the aprotic solvent used in common as the aprotic first solvent, the aprotic second solvent, and the aprotic third solvent include γBL, SL, N-methyl-2-pyrrolidone, and dimethylsulfoxide. A single one or two or more in combination of these aprotic solvents may be contained.

The second treatment solution may contain a solvent, i.e., a non-polar solvent such as toluene or hexane and a protic solvent, different from the aprotic second solvent. Examples of the protic solvent similarly include the protic solvents exemplified as the first solvent. A single one or two or more in combination of these non-polar solvents and protic solvents may be contained. The second treatment solution may also contain a solute. Examples of the solute include the same compounds as described above.

The aprotic second solvent accounts for preferably 30% by mass or more, further preferably 50% by mass or more, particularly preferably 70% by mass or more, relative to a whole solvent contained in the second treatment solution. With this range of the aprotic second solvent, the permeability of the electrolyte solution is more improved. When the electrolyte solution contains a protic solvent together with the aprotic third solvent, it is preferable that the second treatment solution also contain a protic solvent together with the aprotic second solvent.

The second treatment solution is preferably impregnated into capacitor element 10 in an amount ranging from 200 parts by mass to 10,000 parts by mass relative to 100 parts by mass of the conductive polymer with which capacitor element 10 has been impregnated. With this range of the second treatment solution, the impregnation property of the electrolyte solution is more improved.

A method for impregnating capacitor element 10 with the second treatment solution is not particularly limited. Examples of the method include a method for immersing capacitor element 10 in the second treatment solution, a method for dropping the second treatment solution onto capacitor element 10, and a method for coating capacitor element 10 with the second treatment solution.

(iv) Step of Impregnating Capacitor Element with Electrolyte Solution (Fourth Step)

Next, capacitor element 10 is impregnated with the electrolyte solution.

Capacitor element 10 may be impregnated with the electrolyte solution after removal of the second solvent (and/or the first solvent) by a drying step described later. According to the present exemplary embodiment, the permeability of the electrolyte solution is improved even when the capacitor element is impregnated with the electrolyte solution after the removal of the second solvent. At this time, the first solvent may be included in capacitor element 10 or have been removed together with the second solvent.

Especially, capacitor element 10 is preferably impregnated with the electrolyte solution while including the second solvent. With capacitor element 10 being impregnated with the electrolyte solution while including the second solvent, the permeability of the electrolyte solution is more improved. The capacitor element may also be impregnated with the electrolyte solution while including the first solvent together with the second solvent, when the first solvent, the second solvent, and the third solvent are the same solvent.

With capacitor element 10 including or having included the protic second solvent, the electrolyte solution containing the protic third solvent is easily impregnated into a surface and pores of the dielectric layer and an inside of etching pits. Similarly, with capacitor element 10 including or having included the aprotic second solvent, the electrolyte solution containing the aprotic third solvent is easily impregnated into a surface and pores of the dielectric layer and an inside of etching pits.

Impregnation of the electrolyte solution into the surface and pores of the dielectric layer and an inside of etching pits further improves self-restoration ability of the dielectric layer, further reducing leakage current of an electrolytic capacitor obtained. The electrolyte solution substantially functions as a cathode material, and a high impregnation property of the electrolyte solution into the dielectric layer enables acquisition of further large electrostatic capacity.

On the other hand, the conductive polymer in the first treatment solution is impregnated into the capacitor element while maintaining a dispersion state, facilitating formation of a uniform conductive polymer layer. The conductive polymer layer also substantially functions as a cathode material. The uniform conductive polymer layer can more reduce ESR. That is, it is possible to allow an electrolytic capacitor to adequately exhibit both an effect brought about by using the electrolyte solution and an effect brought about by including the conductive polymer layer, according to the present exemplary embodiment.

Impregnation with the electrolyte solution is conducted for a capacitor element that includes preferably 200 parts by mass to 10,000 parts by mass of the first solvent and/or the second solvent (hereinafter, referred to as a liquid collectively), more preferably 300 parts by mass to 8,000 parts by mass of the liquid, particularly preferably 300 parts by mass to 1,000 parts by mass of the liquid, relative to 100 parts by mass of the conductive polymer with which the capacitor element has been impregnated. With these ranges of the liquid, the impregnation property of the electrolyte solution is further improved.

(iv-1) When Third Solvent being Protic Solvent

When the electrolyte solution contains the protic third solvent, examples of the protic third solvent include polyvalent alcohols such as EG and PEG. Especially, the protic third solvent is preferably a high boiling point solvent (e.g., a boiling point of 180° C. or higher). The electrolyte solution may contain a plurality of protic third solvents.

Further, the electrolyte solution may also contain a solvent, i.e., a non-polar solvent such as toluene or hexane and an aprotic solvent, different from the protic third solvent. Examples of the aprotic solvent include amides such as N-methylacetamide, N,N-dimethylformamide, and N-methyl-2-pyrrolidone; esters such as methyl acetate;

ketones such as methyl ethyl ketone and γBL; cyclic sulfones such as SL; ethers such as 1,4-dioxane; and carbonate compounds such as propylene carbonate. A single one or two or more in combination of these non-polar solvents and aprotic solvents may be contained. Especially, the electrolyte solution preferably contains the protic third solvent and an aprotic solvent. With the electrolyte solution containing the protic third solvent and an aprotic solvent, electric conductivity is improved.

The protic third solvent accounts for preferably 20% by mass or more, further preferably 30% by mass or more, relative to a whole solvent contained in the electrolyte solution. The protic third solvent also accounts for preferably 50% by mass or less, further preferably 40% by mass or less, relative to a whole solvent contained in the electrolyte solution. When an aprotic solvent is used together with the protic third solvent, a proportion of the aprotic solvent accounts for preferably 50% by mass or more, further preferably 60% by mass or more, and preferably 80% by mass or less, further preferably 70% by mass or less, relative to a whole solvent contained in the electrolyte solution.

The electrolyte solution may also contain a solute. Examples of the solute include an organic salt in which at least one of an anion and a cation includes an organic substance. As the organic salt, there can be used, for example, mono(trimethylamine) maleate, mono(triethylamine) borodisalicylate, mono(ethyldimethylamine) phthalate, mono(1,2,3,4-tetramethylimidazolinium) phthalate, and mono(1,3-dimethyl-2-ethylimidazolinium) phthalate.

(iv-2) When Third Solvent being Aprotic Solvent

When the electrolyte solution contains the aprotic third solvent, examples of the aprotic third solvent similarly include the aprotic solvents described above. Especially, the aprotic third solvent is preferably a high boiling point solvent (e.g., a boiling point of 180° C. or higher). The electrolyte solution may contain a plurality of aprotic third solvents.

Further, the electrolyte solution may also contain a solvent, i.e., a non-polar solvent such as toluene or hexane and the above-described protic solvents, different from the aprotic third solvent. A single one or two or more in combination of these non-polar solvents and protic solvents may be contained. The electrolyte solution may also contain an above-described solute.

The aprotic third solvent accounts for preferably 50% by mass or more, further preferably 60% by mass or more, relative to a whole solvent contained in the electrolyte solution. The aprotic third solvent also accounts for preferably 80% by mass or less, further preferably 70% by mass or less, relative to a whole solvent contained in the electrolyte solution.

Especially, the electrolyte solution preferably contains the aprotic third solvent and a protic solvent. With the electrolyte solution containing the aprotic third solvent and a protic solvent, electric conductivity is improved. In this case, a proportion of the protic solvent accounts for preferably 20% by mass or more, further preferably 30% by mass or more, and preferably 50% by mass or less, further preferably 40% by mass or less, relative to a whole solvent contained in the electrolyte solution.

A method for impregnating the capacitor element with the electrolyte solution is not particularly limited. For example, there can be used a method for immersing the capacitor element in the electrolyte solution housed in a container, and a method for dropping the electrolyte solution onto the capacitor element. Impregnation may be conducted in an atmosphere under a reduced pressure ranging, for example, from 10 kPa to 100 kPa, preferably from 40 kPa to 100 kPa.

(v) Step of Removing First Solvent and/or Second Solvent Included in Capacitor Element (Fifth Step)

Capacitor element 10 may be subjected to drying such as drying by heating or drying under reduced pressure to remove a liquid (the first solvent and/or the second solvent) included in the capacitor element, before the fourth step of applying the electrolyte solution to capacitor element 10. With this step, an attachment property of particles of the conductive polymer is improved. A liquid removal amount and drying conditions are not particularly limited, but it is preferable to adjust an amount of the liquid included in the capacitor element to 200 parts by mass to 10,000 parts by mass relative to 100 parts by mass of the conductive polymer with which the capacitor element has been impregnated. Particularly, when the first solvent is water, it is preferable to remove almost all water. For example, when the first solvent is vaporized by heating, a heating temperature is preferably a temperature higher than a boiling point of the first solvent. The heating temperature ranges preferably from 50° C. to 300° C., more preferably from 100° C. to 200° C., for example.

With setting, as a series of steps, the step of applying the first treatment solution to the surface of the dielectric layer (second step), the third step, and the fifth step conducted as necessary, the series of steps may be repeated two or more times. Conducting this series of steps a plurality of times can increase coverage of particles of the conductive polymer on the dielectric layer. Alternatively, repetition may be conducted for a step. For example, the third step and further the fifth step may be conducted after the second step is conducted a plurality of times.

(vi) Step of Encapsulating Capacitor Element

Next, the capacitor element to which the electrolyte solution has been applied is encapsulated. Specifically, first, the capacitor element is housed in bottomed case 11 so that lead wires 14A, 14B are positioned on an open upper surface of bottomed case 11. As a material for bottomed case 11, there can be used metals such as aluminum, stainless steel, copper, iron and brass, or an alloy of these metals.

Next, sealing member 12 formed so as to allow lead wires 14A, 14B to penetrate the sealing member is disposed above the capacitor element in which the conductive polymer layer is formed, to encapsulate the capacitor element in bottomed case 11. Sealing member 12 is sufficient as long as the sealing member is an insulating substance. As the insulating substance, an elastic body is preferable, and for example, high heat resistance silicone rubber, fluororubber, ethylene propylene rubber, Hypalon rubber, butyl rubber or isoprene rubber is especially preferable.

Next, bottomed case 11 is, at a part near an opening end, processed by transverse drawing, and is, at the opening end, swaged to sealing member 12 for curling. Last, base plate 13 is disposed on a curled part of the bottomed case to complete encapsulation. Subsequently, an aging treatment may be performed while a rated voltage is applied.

In the exemplary embodiment described above, a wound electrolytic capacitor has been described. The application range of the present disclosure, however, is not limited to the wound electrolytic capacitor, and can be applied to other electrolytic capacitors such as a chip electrolytic capacitor including a metal sintered body as an anode body, and a laminated electrolytic capacitor including a metal plate as an anode body.

EXAMPLES

Hereinafter, the present disclosure is described in more detail with reference to examples. The present disclosure, however, is not limited to the examples.

Example 1

In the present examples, manufactured was a wound electrolytic capacitor (Φ 6.3 mm×L (length) 5.8 mm) having a rated voltage of 35 V and a rated electrostatic capacity of 47 µF. Hereinafter, a specific method for producing the electrolytic capacitor is described.

(Step of Preparing Anode Body)

A 100 µm-thick aluminum foil was subjected to etching to roughen a surface of the aluminum foil. Then, a dielectric layer was formed on the surface of the aluminum foil by a chemical conversion treatment. The chemical conversion treatment was performed by immersing the aluminum foil in an ammonium adipate solution, followed by application of a voltage of 60 V.

(Step of Preparing Cathode Body)

A 50-µm-thick aluminum foil was subjected to etching to roughen a surface of the aluminum foil.

(First Step: Manufacture of Capacitor Element)

An anode lead tab and a cathode lead tab were connected to the anode body and the cathode body, respectively, and the anode body and the cathode body were would with a separator interposed between the anode body and the cathode body while the lead tabs were rolled in the anode body, the cathode body and the separator, to give a capacitor element. Ends of the lead tabs protruding from the capacitor element were connected to an anode lead wire and a cathode lead wire, respectively. Then, the manufactured capacitor element was subjected to a chemical conversion treatment again to form a dielectric layer at a cut end of the anode body. Next, an end of an outer surface of the capacitor element was fixed with a fastening tape.

(Second Step: Impregnation with First Treatment Solution)

A mixed solution was prepared by dissolving 3,4-ethylene dioxythiophene and dopant polystyrenesulfonic acid in ion-exchanged water (first solvent). Ferric sulfate and sodium persulfate dissolved in ion-exchanged water were added to the resultant mixed solution while the mixed solution was stirred, to cause a polymerization reaction. After the reaction, the resultant reaction solution was dialyzed to remove unreacted monomers and an excessive oxidant so that a first treatment solution was obtained, which included a dispersion liquid containing about 5% by mass of polyethylene dioxythiophene doped with polystyrenesulfonic acid.

Then, the capacitor element was impregnated with the resultant first treatment solution for 5 minutes.

(Third Step: Impregnation with Second Treatment Solution)

A second treatment solution containing γBL as the second solvent was prepared. The capacitor element in which the first treatment solution remained was impregnated with this second treatment solution.

(Fifth Step: Drying Step)

Next, the capacitor element was dried at 150° C. for 30 minutes. A conductive polymer layer was formed in the capacitor element. In the dried capacitor element, a liquid (second solvent) remained in an amount of 1,000 parts by mass relative to 100 parts by mass of the conductive polymer with which the capacitor element had been impregnated.

(Fourth Step: Impregnation with Electrolyte Solution)

As the third solvent, γBL and SL were prepared, and γBL SL, and mono(ethyldimethylamine) phthalate (solute) were mixed in a mass ratio of 40:35:25 to prepare an electrolyte solution. The capacitor element was impregnated with this electrolyte solution.

(Step of Encapsulating Capacitor Element)

The electrolyte solution-impregnated capacitor element was housed in an outer case as shown in FIG. 1 and encapsulated to manufacture an electrolytic capacitor.

For the resultant electrolytic capacitor, electrostatic capacity, ESR, and leakage current (LC) were measured. Results are shown in Table 1. Each of characteristic values was acquired as an average of 300 samples.

Example 2

An electrolytic capacitor was manufactured in the same manner as in Example 1 except that used as the second treatment solution and the electrolyte solution were a solution containing EG as the second solvent, and a solution containing EG as the third solvent and mono(ethyldimethylamine) phthalate as a solute in a mass ratio of 75:25, respectively. In the capacitor element directly before impregnation with the electrolyte solution, a liquid (second solvent) remained in an amount of 1,000 parts by mass relative to 100 parts by mass of the conductive polymer with which the capacitor element had been impregnated. Evaluation results are shown in Table 1.

Example 3

An electrolytic capacitor was manufactured in the same manner as in Example 2 except that a first treatment solution was used, which contained, as the first solvent, water and EG in a mass ratio of 75:25. In the capacitor element directly before impregnation with the electrolyte solution, a liquid (first solvent and second solvent) remained in an amount of 1,300 parts by mass relative to 100 parts by mass of the conductive polymer with which the capacitor element had been impregnated. Evaluation results are shown in Table 1.

Comparative Example 1

An electrolytic capacitor was manufactured in the same manner as in Example 1 except that the same electrolyte solution as in Example 2 was used. In the capacitor element directly before impregnation with the electrolyte solution, a liquid (second solvent) remained in an amount of 1,000 parts by mass relative to 100 parts by mass of the conductive polymer with which the capacitor element had been impregnated. Evaluation results are shown in Table 1.

Comparative Example 2

An electrolytic capacitor was manufactured in the same manner as in Example 1 except that the same second treatment solution as in Example 2 was used. In the capacitor element directly before impregnation with the electrolyte solution, a liquid (second solvent) remained in an amount of 1,000 parts by mass relative to 100 parts by mass of the conductive polymer with which the capacitor element had been impregnated. Evaluation results are shown in Table 1.

TABLE 1

| | First solvent | Second solvent | Third solvent | Evaluation | | |
| --- | --- | --- | --- | --- | --- | --- |
| | | | | Electrostatic capacity/ μF | ESR/ mΩ | LC/ μA |
| Example 1 | Water | γ BL | γ BL, SL | 41.2 | 23.2 | 2.29 |
| Example 2 | Water | EG | EG | 42.3 | 22.7 | 0.51 |
| Example 3 | Water, EG | EG | EG | 42.5 | 22.3 | 0.55 |
| Comparative Example 1 | Water | γ BL | EG | 42.3 | 24.6 | 13.2 |
| Comparative Example 2 | Water | EG | γ BL, SL | 40.8 | 21.2 | 10.5 |

In Example 1 in which both the second solvent and the third solvent are an aprotic solvent, and in Examples 2 and 3 in which both the second solvent and the third solvent are a protic solvent, particularly, an LC value is suppressed to a very low level, as compared with Comparative Examples 1 and 2. This is considered to result from the fact that the impregnation property of the electrolyte solution increased to improve the self-restoration ability of the dielectric layer.

The present disclosure can be used for electrolytic capacitors including a conductive polymer layer and an electrolyte solution as cathode materials.

What is claimed is:

1. A method for producing an electrolytic capacitor, the method comprising:
a first step of preparing a capacitor element that includes an anode body on which a dielectric layer is formed;
a second step of impregnating the capacitor element with a first treatment solution containing a first solvent and a conductive polymer;
a third step of impregnating, after the second step, the capacitor element with a second treatment solution containing a second solvent; and
a fourth step of impregnating, after the third step, the capacitor element with an electrolyte solution containing a third solvent,
both the second solvent and the third solvent being an aprotic solvent.

2. The method for producing an electrolytic capacitor according to claim 1, wherein the aprotic solvent is one selected from the group consisting of γ-butyrolactone, N-methyl-2-pyrrolidone, dimethylsulfoxide, sulfolane, propylene carbonate, and dimethyl carbonate.

3. The method for producing an electrolytic capacitor according to claim 1, wherein the second solvent and the third solvent are a same solvent.

4. The method for producing an electrolytic capacitor according to claim 2, wherein the second solvent and the third solvent are a same solvent.

5. The method for producing an electrolytic capacitor according to claim 1, wherein the capacitor element is, in the fourth step, impregnated with the electrolyte solution while including the second solvent.

6. The method for producing an electrolytic capacitor according to claim 2, wherein the capacitor element is, in the fourth step, impregnated with the electrolyte solution while including the second solvent.

7. The method for producing an electrolytic capacitor according to claim 3, wherein the capacitor element is, in the fourth step, impregnated with the electrolyte solution while including the second solvent.

8. The method for producing an electrolytic capacitor according to claim 4, wherein the capacitor element is, in the fourth step, impregnated with the electrolyte solution while including the second solvent.

9. The method for producing an electrolytic capacitor according to claim 1, wherein the first solvent, the second solvent, and the third solvent are a same solvent.

10. The method for producing an electrolytic capacitor according to claim 2, wherein the first solvent, the second solvent, and the third solvent are a same solvent.

11. The method for producing an electrolytic capacitor according to claim 5, wherein the first solvent, the second solvent, and the third solvent are a same solvent.

12. The method for producing an electrolytic capacitor according to claim 6, wherein the first solvent, the second solvent, and the third solvent are a same solvent.

* * * * *